United States Patent
Kanda

(10) Patent No.: US 10,396,762 B2
(45) Date of Patent: Aug. 27, 2019

(54) FLIP-FLOP CIRCUIT AND SEMICONDUCTOR INTEGRATED CIRCUIT DEVICE

(71) Applicant: FUJITSU LIMITED, Kawasaki-shi, Kanagawa (JP)

(72) Inventor: Kouichi Kanda, Chofu (JP)

(73) Assignee: FUJITSU LIMITED, Kawasaki (JP)

( * ) Notice: Subject to any disclaimer, the term of this patent is extended or adjusted under 35 U.S.C. 154(b) by 62 days.

(21) Appl. No.: 15/695,333

(22) Filed: Sep. 5, 2017

(65) Prior Publication Data

US 2018/0076798 A1 Mar. 15, 2018

(30) Foreign Application Priority Data

Sep. 9, 2016 (JP) ................................. 2016-177069

(51) Int. Cl.
*H03K 3/356* (2006.01)
*H03K 5/159* (2006.01)

(52) U.S. Cl.
CPC . *H03K 3/356104* (2013.01); *H03K 3/356121* (2013.01); *H03K 5/159* (2013.01)

(58) Field of Classification Search
None
See application file for complete search history.

(56) References Cited

U.S. PATENT DOCUMENTS

| 7,583,123 | B2 | 9/2009 | Kanda et al. | |
|---|---|---|---|---|
| 7,600,167 | B2 * | 10/2009 | Shoda | G01R 31/31854 324/750.3 |
| 7,613,969 | B2 * | 11/2009 | Bhatia | G01R 31/31859 327/202 |
| 7,843,218 | B1 * | 11/2010 | Ramaraju | G01R 31/31854 326/38 |
| 7,855,587 | B1 * | 12/2010 | Su | H03K 3/356139 327/208 |
| 2012/0002500 | A1 | 1/2012 | Lin | |
| 2013/0127507 | A1 * | 5/2013 | Zhuang | H03K 3/356139 327/203 |
| 2016/0043706 | A1 * | 2/2016 | Elkin | H03K 3/35625 327/202 |

FOREIGN PATENT DOCUMENTS

| JP | 2006-203479 | 8/2006 |
|---|---|---|
| JP | 2015-173465 | 10/2015 |

OTHER PUBLICATIONS

H. Partovi et al., "Flow-Through Latch and Edge-Triggered Flip-flop Hybrid Elements," ISSCC Dig. Tech. Papers, pp. 138-139, Feb. 1996.
V. Fiore et al., "A 13.56 MHz RFID Tag with Active Envelope Detection in an Organic Complementary TFT Technology," ISSCC Dig. Tech. Papers, Feb. 2014, 22 pages.

* cited by examiner

*Primary Examiner* — Lincoln D Donovan
*Assistant Examiner* — Khareem E Almo
(74) *Attorney, Agent, or Firm* — Staas & Halsey LLP

(57) ABSTRACT

A flip-flop circuit includes a data capture circuit that captures data based on a clock, a data hold circuit that holds an output of the data capture circuit based on the clock, and a timing control circuit that controls coupling between the output of the data capture circuit and the data hold circuit based on the clock, when the data capture circuit captures new data based on the clock, the timing control circuit performing control so as to temporarily interrupt the coupling between the output of the data capture circuit and the data hold circuit.

10 Claims, 12 Drawing Sheets

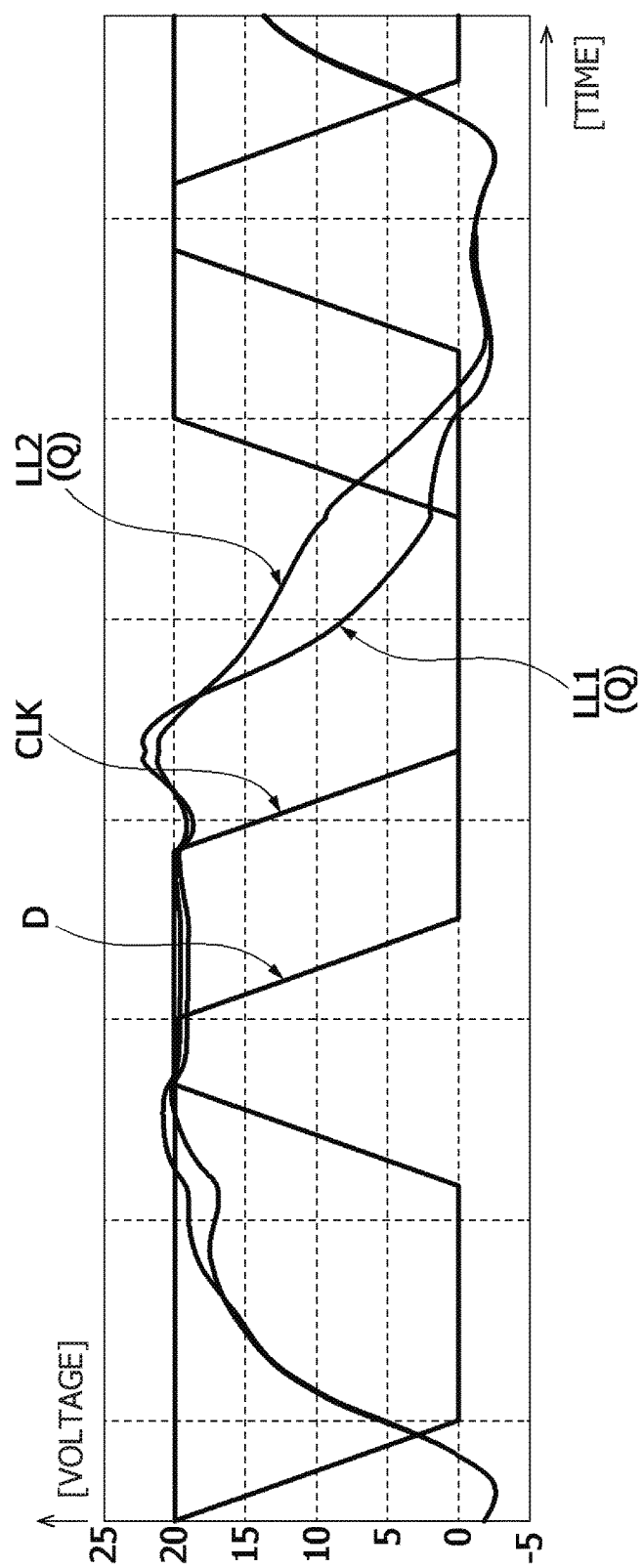

FLIP-FLOP CIRCUIT AND SEMICONDUCTOR INTEGRATED CIRCUIT DEVICE

CROSS-REFERENCE TO RELATED APPLICATION

This application is based upon and claims the benefit of priority of the prior Japanese Patent Application No. 2016-177069, filed on Sep. 9, 2016, the entire contents of which are incorporated herein by reference.

FIELD

The embodiments discussed herein are related to a flip-flop circuit and a semiconductor integrated circuit device.

BACKGROUND

In recent years, organic semiconductor field-effect transistors (organic semiconductor field effect transistors (FETs): organic transistors) operating with low power consumption have been studied and developed, and radio frequency identification (RFID), for example, has been drawing attention as an object for application of the organic transistors. Here, an operating speed of approximately 20 to 100 kb/s as defined by a standard such as ISO 14443, ISO 15693, or the like is desired for RFID.

However, in the case of organic transistors, there is a large difference between current driving forces of a p-channel type (p-type) transistor and an n-type transistor (p-type transistor>>n-type transistor). Therefore, flip-flop circuits of a conventional type have a very slow operating speed, and it is difficult to apply organic transistors to RFID. A circuit design that maximizes the performance of an organic process is desired for realization of the application of organic transistors to RFID.

Incidentally, various proposals have been made for flip-flop circuits.

As described above, a flip-flop circuit based on a new circuit design is desired to apply organic transistors with low power consumption to RFID (semiconductor integrated circuit device). In addition, the problem of the flip-flop circuits which problem is caused by the difference between the current driving forces of a p-type transistor and an n-type transistor is not limited to organic transistors.

Also in a case of inorganic transistors such as metal oxide semiconductor (MOS) FETs or the like, there is a difference between current driving forces of a p (channel type) MOS transistor and an nMOS transistor (pMOS transistor<nMOS transistor). Therefore, a flip-flop circuit according to a present technology to be described later in detail may be expected to be improved in operating speed even when the flip-flop circuit is formed with transistors other than organic transistors.

For example, the flip-flop circuit (semiconductor integrated circuit device) according to the present technology may be RFID using organic transistors or may be applied to various other semiconductor integrated circuit devices. Further, the flip-flop circuit according to the present technology may be flip-flop circuits formed with organic transistors or may be flip-flop circuits using other transistors such as MOS transistors or the like.

The followings are reference documents.
[DOCUMENT 1] Japanese Laid-open Patent Publication No. 2015-173465,
[DOCUMENT 2] Japanese Laid-open Patent Publication No. 2006-203479,
[DOCUMENT 3] U.S. Pat. No. 7,583,123,
[DOCUMENT 4] H. Partovi et al., "Flow-Through Latch and Edge-Triggered Flip-flop Hybrid Elements," ISSCC Dig. Tech. Papers, pp. 138-139, February 1996, and
[DOCUMENT 5] V. Fiore et al., "A 13.56 MHz RFID Tag with Active Envelope Detection in an Organic Complementary TFT Technology," ISSCC Dig. Tech. Papers, pp. 492-494, February 2014.

SUMMARY

According to an aspect of the embodiments, a flip-flop circuit includes a data capture circuit that captures data based on a clock, a data hold circuit that holds an output of the data capture circuit based on the clock, and a timing control circuit that controls coupling between the output of the data capture circuit and the data hold circuit based on the clock, when the data capture circuit captures new data based on the clock, the timing control circuit performing control so as to temporarily interrupt the coupling between the output of the data capture circuit and the data hold circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram of assistance in explaining a result of simulation of operation of the flip-flop circuit illustrated in FIG. 11.

DESCRIPTION OF EMBODIMENTS

First, before detailed description is made of examples of a flip-flop circuit and a semiconductor integrated circuit device, differences between a silicon transistor and an organic transistor as well as examples of a flip-flop circuit and problems of the flip-flop circuit will be described with reference to FIGS. 1A to 5.

Figure 1A:
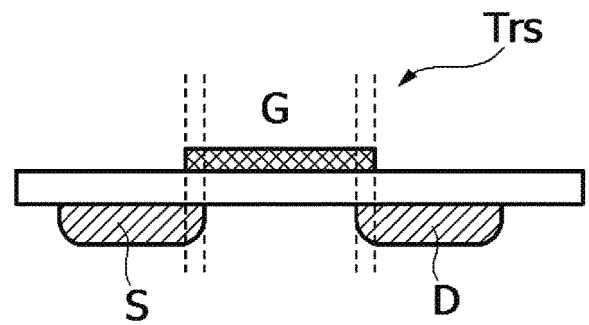
FIGS. 1A, 1B, 1C, and 1D are diagrams of assistance in explaining a silicon transistor and an organic transistor by comparison.
Figure 1B:
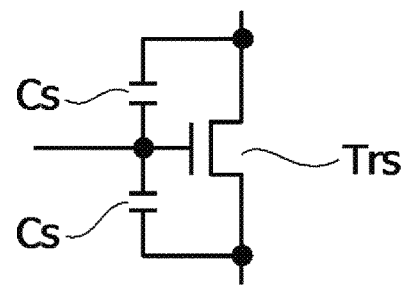
Figure 1C:
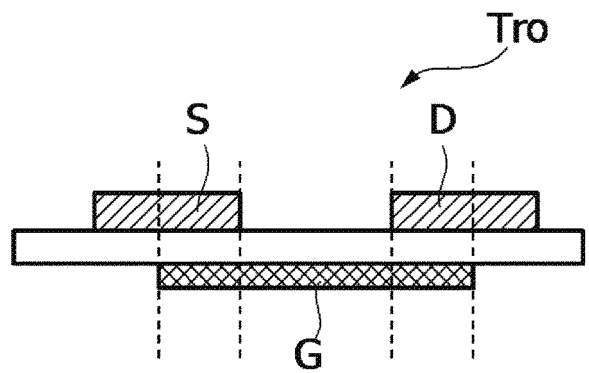
Figure 1D:
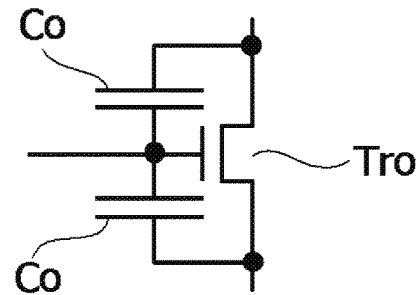

FIGS. 1A to 1D are diagrams of assistance in explaining a silicon transistor and an organic transistor by comparison. Here, FIG. 1A and FIG. 1B illustrate a silicon transistor (MOSFET). FIG. 1A is a sectional view schematically illustrating the structure of the silicon transistor. FIG. 1B is an equivalent circuit diagram of the silicon transistor. In addition, FIG. 1C and FIG. 1D illustrate an organic transistor (organic semiconductor FET). FIG. 1C is a sectional view schematically illustrating the structure of the organic transistor. FIG. 1D is an equivalent circuit diagram of the organic transistor.

As illustrated in FIG. 1A, the MOS transistor (silicon transistor) may be manufactured by using a self-alignment (automatic alignment) technology, for example, and may reduce an area in which a source region and a drain region overlap a gate region, for example. Further, because of a fine wiring width (design rule), parasitic capacitances (gate capacitances) between the gate and the source and between the gate and the drain may be reduced, as illustrated in the equivalent circuit diagram of FIG. 1B.

On the other hand, as illustrated in FIG. 1C, it is difficult to apply the self-alignment technology to the organic transistor, so that an alignment margin is increased and parasitic capacitances between a gate and a source and between the gate and a drain are increased. In addition, also because of a wide wiring width, the parasitic capacitances between the gate and the source and between the gate and the drain are increased, as illustrated in the equivalent circuit diagram of FIG. 1C.

Further, organic transistors have problems of a difference between threshold voltages (Vth) of a p-type transistor and an n-type transistor (for example, Vth of a p-type transistor is low and Vth of an n-type transistor is high) and a difference between current driving forces of the p-type and n-type transistors (p-type>>n-type). In addition, in the case of organic transistors, there is a known problem of large crosstalk between different nodes or a tendency for data accumulated at a floating node to be destroyed due to a leak.

However, organic transistors may operate with low power consumption, and have recently been improved in operating speed. Thus, the application of organic transistors to RFID and the like has been drawing attention. It is to be noted that the flip-flop circuit (semiconductor integrated circuit device) according to the present technology may be RFID using organic transistors or may be widely applied to various semiconductor integrated circuit devices. Further, the flip-flop circuit according to the present technology may be flip-flop circuits formed with organic transistors or may also use other transistors such as MOS transistors or the like, as described above.

Figure 2:
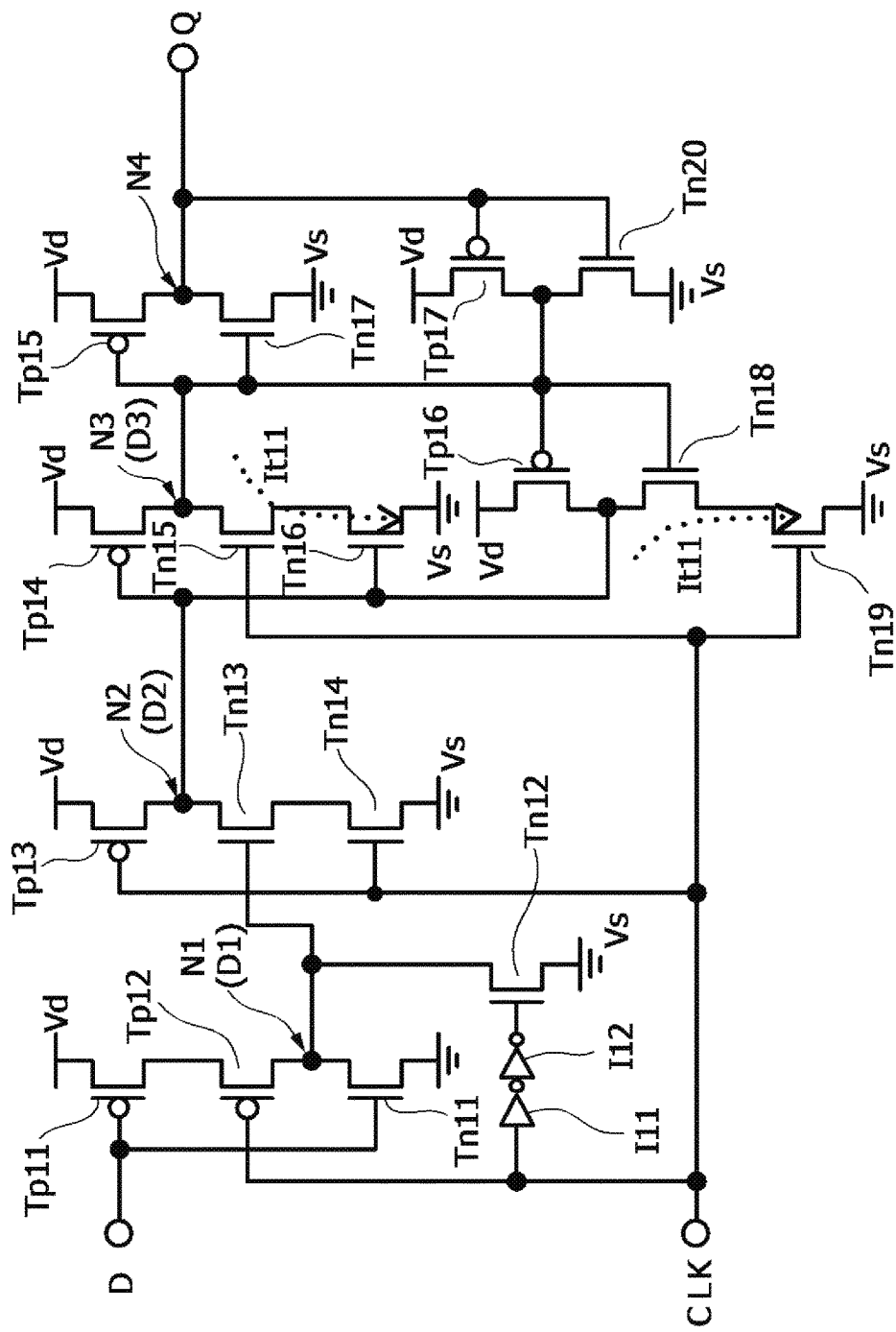
FIG. 2 is a circuit diagram illustrating a first example of a flip-flop circuit.

FIG. 2 is a circuit diagram illustrating an example of a flip-flop circuit. Incidentally, the flip-flop circuit illustrated in FIG. 2 captures data D in timing in which a clock CLK rises from a low level "Low" to a high level "H."

As illustrated in FIG. 2, the flip-flop circuit includes pMOS transistors Tp11 to Tp17 and nMOS transistors Tn11 to Tn20. Data D is input to the gates of the transistors Tp11 and Tn11. A clock CLK is input to the gates of the transistors Tp12, Tp13, Tn14, Tn15, and Tn19. Incidentally, the clock CLK is input to the gate of the transistor Tn12 via a clock delay circuit (inverters I11 and I12).

A signal D1 of a common coupling node N1 of the transistors Tp12, Tn11, and Tn12 is input to the gate of the transistor Tn13. In addition, a signal D2 of a coupling node N2 of the transistors Tp13 and Tn13 is input to the gates of the transistors Tp14 and Tn16 and a coupling node of the transistors Tp16 and Tn18. Further, a signal D3 of a coupling node N3 of the transistors Tp14 and Tn15 is input to the gates of the transistors Tp15 and Tn17 (input of an inverter). Data Q is output from a coupling node N4 of the transistors Tp15 and Tn17 (output of the inverter).

Here, during a period during which the clock CLK is "Low," the transistors Tp12 and Tp13 are on, and the transistors Tn15 and Tn19 are off. At this time, when the input data D is "Low," the node N1 becomes "High" to turn on Tn13. However, because Tn14 is off and Tp13 is on, the node N2 becomes "High." Thereby, Tp14 is turned off and Tn16 is turned on. However, because Tn15 is off, the node N3 is set in a floating state. In addition, when the input data D is "High," the node N1 becomes "Low" to turn off Tn13. Because Tp13 is on, the node N2 becomes "High." Thereby, Tp14 is turned off and Tn16 is turned on. However, because Tn15 is off, the node N3 is set in a floating state. For example, during the period during which the clock CLK is at the low level "Low," the node N3 is in a floating state.

On the other hand, during a period during which the clock CLK is "High," the transistors Tp12 and Tp13 are off, and the transistors Tn15 and Tn19 are on. In addition, when the clock CLK changes from "Low" to "High," the transistor Tn12 changes from off to on after a delay time provided by the inverters I11 and I12 (clock delay circuit). At this time, when the input data D is "Low," the node N1 is set in a floating state. However, the node N1 changes to "Low" after the delay time provided by the clock delay circuit (I11 and I12). In addition, when the input data D is "High," the node N1 becomes "Low."

In the flip-flop circuit illustrated in FIG. 2, when both the data (first data) D2 of N2 and the data (second data) D3 of N3 are "High," and CLK changes from "Low" to "High," racing may occur unless N3 changes before N2. Here, the second data represents data immediately before the first data (data captured by an immediately preceding clock).

For example, when the data D2 of the node N2 becomes "High," erroneous data may be output unless the data D3 of the node N3 is made "Low" by drawing out a sufficient charge (making a current It11 to flow) by the transistors Tn15 and Tn16 in an on state. In addition, when the data D3 of the node N3 is "High," the data D2 of the node N2 may become "Low" with a charge drawn out (current It12 made to flow) by the transistors Tn18 and Tn19 in an on state. Here, the data D2 and D3 is input and output of the transistors Tp14 and Tn16 and the transistors Tp16 and Tn18 (two cross-coupled inverters: a keeper circuit). The problem is avoided by reducing the transistor size of the keeper circuit. Alternatively, when racing as described above may occur, a flip-flop circuit is designed with operating speed sacrificed, for example, with a certain delay time provided, to avoid erroneous operation.

Figure 3:
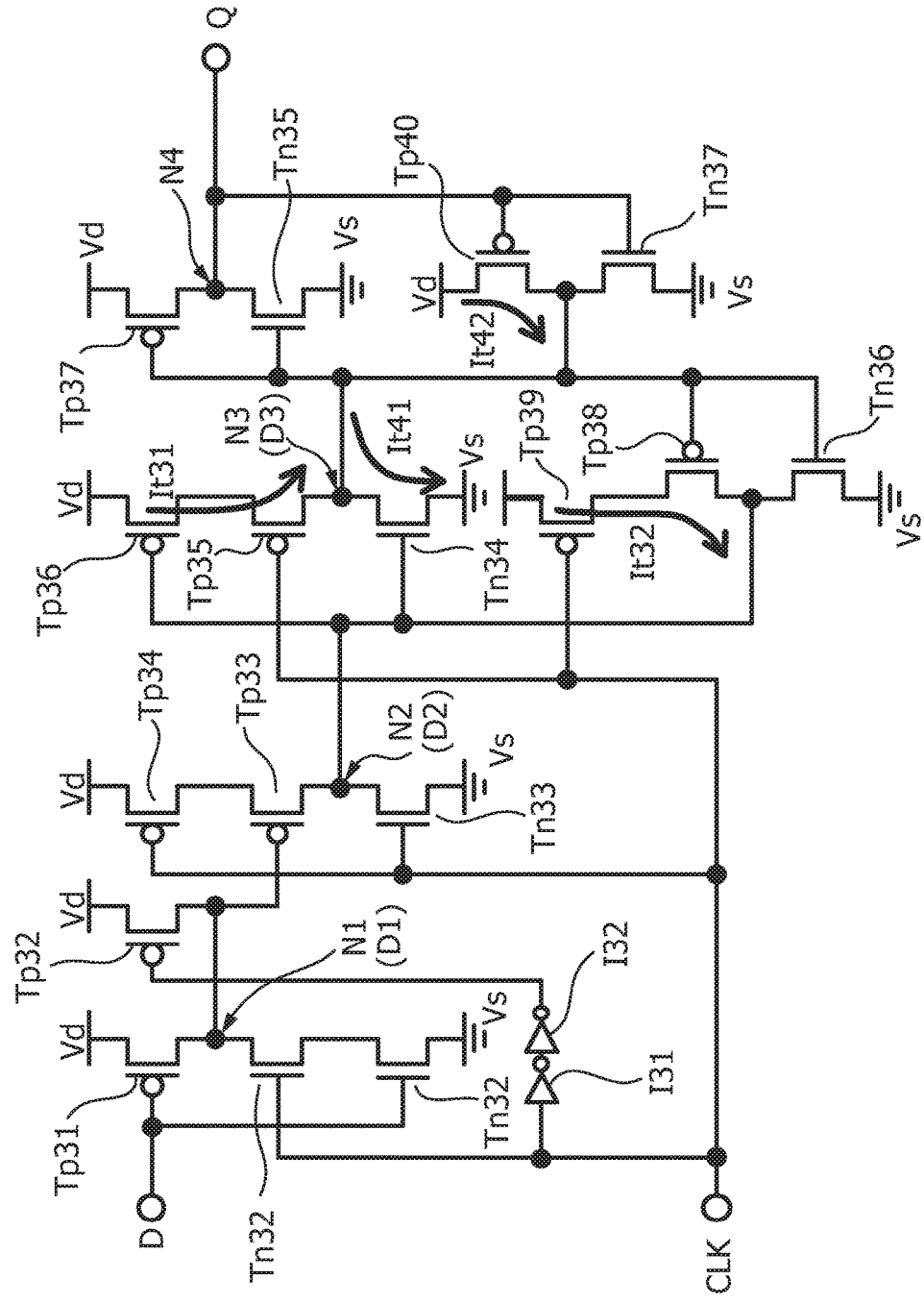
FIG. 3 is a circuit diagram illustrating a second example of a flip-flop circuit.

FIG. 3 is a circuit diagram illustrating a second example of a flip-flop circuit. The flip-flop circuit according to the second example is obtained by reversing the polarity of the flip-flop circuit according to the first example illustrated in FIG. 2. For example, n-type transistors Tn31 to Tn37 and p-type transistors Tp31 to Tp40 in the flip-flop circuit illustrated in FIG. 3 correspond to the pMOS transistors Tp11 to Tp17 and the nMOS transistors Tn11 to Tn20 in the flip-flop circuit illustrated in FIG. 2. Incidentally, the flip-flop circuit illustrated in FIG. 3 captures data D in timing in which a clock CLK falls from a high level "High" to a low level "Low."

Now, when a flip-flop circuit using organic transistors, for example, is considered, the flip-flop circuit illustrated in FIG. 2 is not desirable because the flip-flop circuit illustrated in FIG. 2 includes nMOS transistors (n-type transistors) stacked in two stages. For example, in the case of organic transistors under the present circumstances, the current driving force of an n-type transistor is significantly inferior to that of a p-type transistor. Thus, operation performance may be ensured when p-type transistors rather than n-type transistors are stacked in two stages.

However, the flip-flop circuit illustrated in FIG. 3 also has the problem of racing of the data D2 and D3 at the nodes N2 and N3 (currents It31 and It32), the problem having been described with reference to FIG. 2. Incidentally, in the case of organic transistors, there is a large difference between the threshold voltages (Vth) of a p-type transistor and an n-type transistor, and thus it is difficult to make adjustment by changing the size of the transistors. Further, in the case of organic transistors, there is a large difference between the current driving forces of a p-type transistor and an n-type transistor (p-type>>n-type), a conflict occurs between first data (new data) and second data (immediately preceding (old) data), and there is a fear of an increase in delay.

For example, with respect to the node N3, consideration will be given to a case where CLK changes from "High" to "Low" and the data D2 of N2 changes from "Low" to "High." In this case, a conflict occurs between an operation in which Tn34 is turned on to make N3 "Low" based on new data (D2="High") (operation in which a current It41 flows) and an operation in which Tp40 is turned on to keep N3 "High" based on immediately preceding data (D3="High") (operation in which a current It42 flows). For example, the operation of the n-type transistor Tn34 and the operation of the p-type transistor Tp40 conflict with each other.

This becomes a particularly significant problem when there is a large difference between the current driving forces of a p-type transistor and an n-type transistor as in the case of organic transistors. For example, the driving capability of the n-type transistor Tn34 based on new data is inferior to the driving capability of the p-type transistor Tp40 based on old data. There is thus a fear of inviting a delay in operation of the flip-flop circuit or erroneous operation of the flip-flop circuit.

Figure 4:
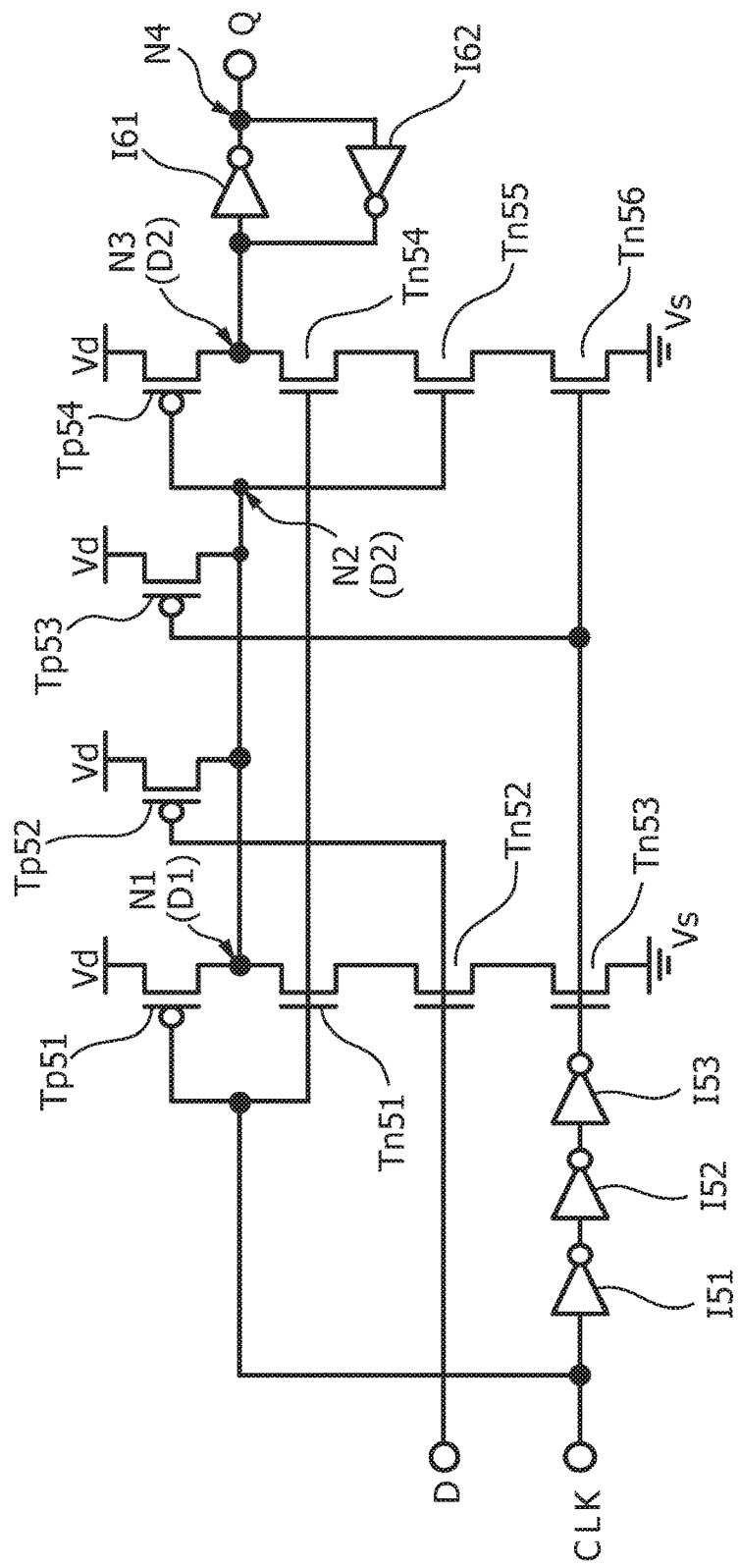
FIG. 4 is a circuit diagram illustrating a third example of a flip-flop circuit.

FIG. 4 is a circuit diagram illustrating a third example of a flip-flop circuit, and illustrates a hybrid latch flip-flop. The flip-flop circuit illustrated in FIG. 4 includes pMOS transistors Tp51 to Tp54, nMOS transistors Tn51 to Tn56, and inverters I51 to I53, I61, and I62. Incidentally, in FIG. 4, a coupling node (N1) of the transistors Tp51 and Tn51 is directly coupled to a node (N2) of gate inputs of the transistors Tp54 and Tn55. In addition, in the flip-flop circuit illustrated in FIG. 4, nMOS transistors (Tn51 to Tn53 and Tn54 to Tn56) are stacked in three stages. Here, the inverters I61 and I62 correspond to a keeper circuit.

Also in the flip-flop circuit illustrated in FIG. 4, as in the flip-flop circuit illustrated in FIG. 3, there is a fear of the occurrence of a conflict between new data (data of the node N2 (N1)) D2 (D1) and immediately preceding (old) data (data of the node N3) D3. Thus, the problem of a conflict between new data and immediately preceding data may be the flip-flop circuit of FIG. 3 in which organic transistors are used or may similarly occur in various flip-flop circuits, depending on kinds and characteristics of transistors used, specifications desired for the circuits, or the like.

Figure 5A:
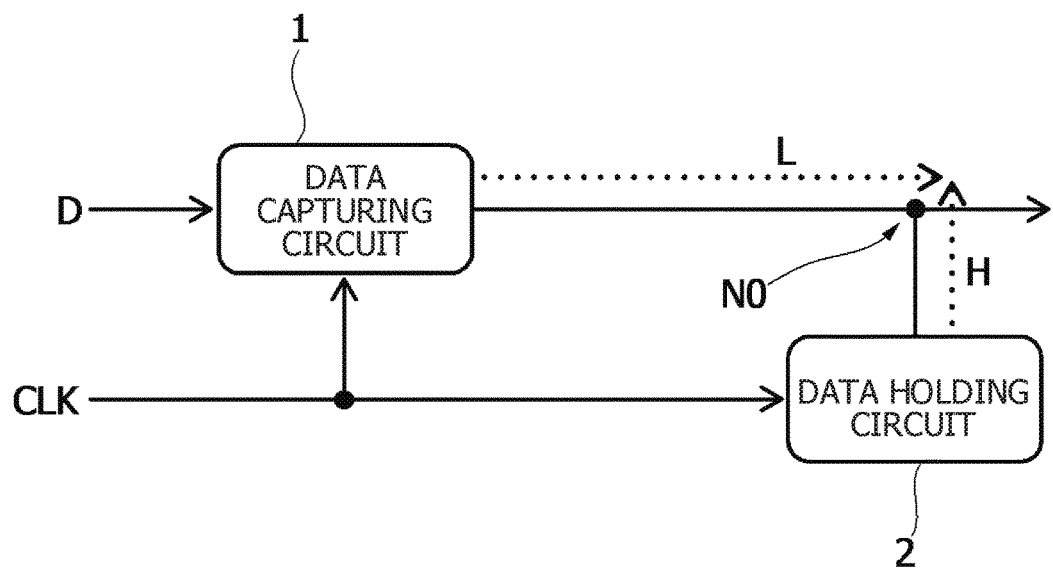
FIGS. 5A and 5B are diagrams of assistance in schematically explaining the above flip-flop circuits according to the first to third examples.
Figure 5B:
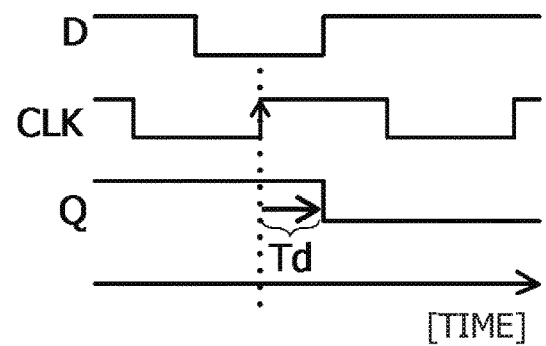

FIGS. 5A and 5B are diagrams of assistance in schematically explaining the flip-flop circuits in the first to third examples described above. Here, FIG. 5A is a block diagram schematically illustrating principal parts of the flip-flop circuits in the first to third examples. FIG. 5B is a timing chart of assistance in explaining operation of the flip-flop circuit illustrated in FIG. 5A.

As illustrated in FIG. 5A, in the first to third examples, with respect to a same node N0, a conflict occurs between a level (for example, "Low") of a data capture circuit 1 based on data D (new data) and a level (for example, "High") of a data hold circuit (keeper circuit) 2 based on immediately preceding data.

For example, as illustrated in FIG. 5B, in a case where the data D is captured at a transition of the clock CLK, when the outputs of the data capture circuit 1 and the data hold circuit 2 conflict with each other with respect to the same node N0, for example, a delay Td occurs in output data Q. Incidentally, while FIG. 5B represents the case where the data D is captured in timing in which the clock CLK rises from "Low" to "High," a case where the data D is captured in timing in which CLK falls from "High" to "Low" is similarly to the case described earlier.

Figure 6A:
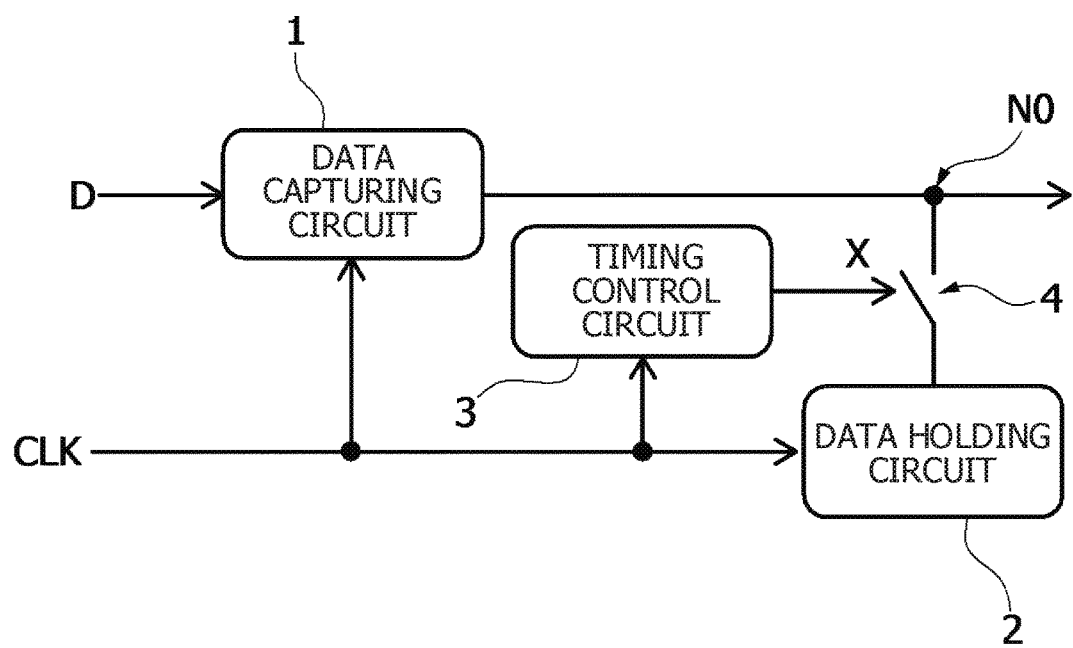
FIGS. 6A and 6B are diagrams of assistance in schematically explaining a flip-flop circuit according to a present technology.
Figure 6B:
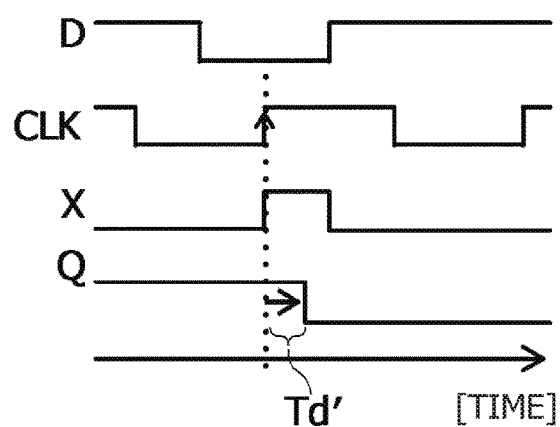

Examples of a flip-flop circuit and a semiconductor integrated circuit device will hereinafter be described in detail with reference to the accompanying drawings. FIGS. 6A and 6B are diagrams of assistance in schematically explaining a flip-flop circuit according to the present technology, and are diagrams corresponding to FIGS. 5A and 5B described above. Here, FIG. 6A is a block diagram schematically illustrating principal parts of the flip-flop circuit according to the present technology. FIG. 6B is a timing chart of assistance in explaining operation of the flip-flop circuit illustrated in FIG. 6A.

As is clear from comparison of FIG. 6A with FIG. 5A described above, the flip-flop circuit according to the present technology is formed by further providing a timing control circuit 3 and a switch (switch element) 4 to the flip-flop circuit of FIG. 5A. The switch 4 is disposed between the output node N0 of the data capture circuit 1 and the output of the data hold circuit 2. The switch 4 is subjected to on/off control by an output signal X of the timing control circuit 3.

For example, the flip-flop circuit according to the present technology interrupts the coupling of the output of the data hold circuit 2 and the node N0 for a given period (for a moment) by the switch 4, and thereby changes the node N0 to a level based on new data. The switch 4 is thereafter coupled, so that the data hold circuit 2 holds the level of the node N0.

As illustrated in FIG. 6B, the flip-flop circuit according to the present technology has a delay Td' due to an off period of the switch 4 according to the signal X from a transition of the clock CLK. A higher speed may be achieved by making the delay Td' shorter than the delay Td in FIG. 5B. It is to be noted that, as described earlier, the present technology may be flip-flop circuits (semiconductor integrated circuit devices) using organic transistors or may use various transistors. Further, while the application of the present technology exerts significant effects in RFID using organic transistors with low power consumption, it is needless to say that the present technology may be RFID or may be applied to various other semiconductor integrated circuit devices.

Figure 7:
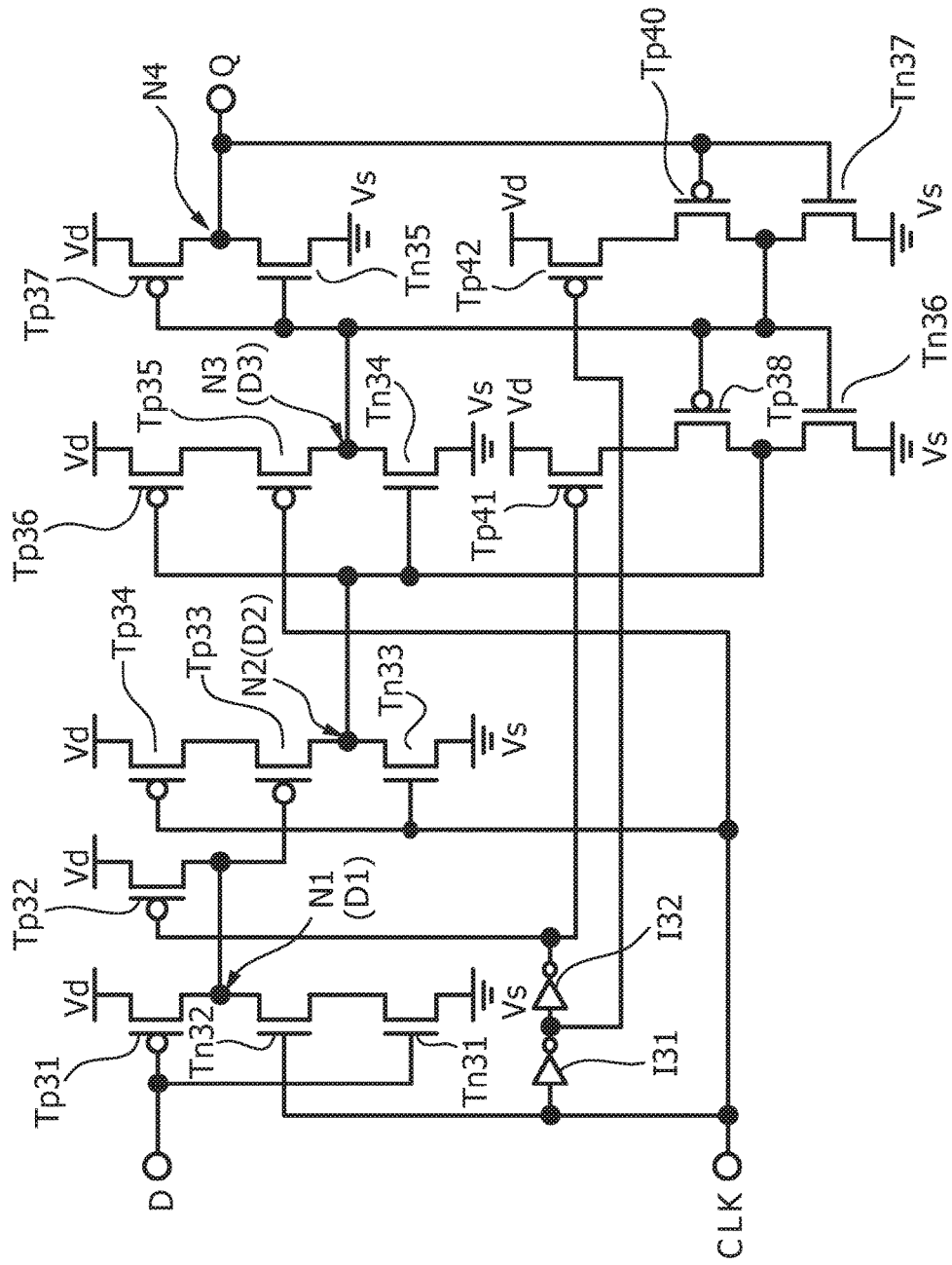
FIG. 7 is a circuit diagram illustrating a first embodiment of a flip-flop circuit.

FIG. 7 is a circuit diagram illustrating a first embodiment of a flip-flop circuit. The flip-flop circuit according to the first embodiment has a different configuration of p-type transistors Tp41 and Tp42 than in the flip-flop circuit illustrated in FIG. 3 described above. For example, as illustrated in FIG. 7, in the flip-flop circuit according to the first embodiment, the p-type transistor Tp42 is inserted between a high-potential power supply line (first power supply line) Vd and the p-type transistor Tp40 in the flip-flop circuit illustrated in FIG. 3. Here, the output of the inverter I31 (clock delay circuit: the timing control circuit 3) is input to the gate of the transistor Tp42. Further, in the flip-flop circuit according to the first embodiment, the p-type transistor Tp39 in the flip-flop circuit illustrated in FIG. 3 is replaced with the p-type transistor Tp41 that has the output of the inverter I32 input to a gate thereof. Incidentally, the transistors Tp41 and Tp42 correspond to the switch element 4 in FIG. 6A. In addition, it is needless to say that the p-type transistors may be pMOS transistors and that the n-type transistors may be nMOS transistors.

Figure 8:
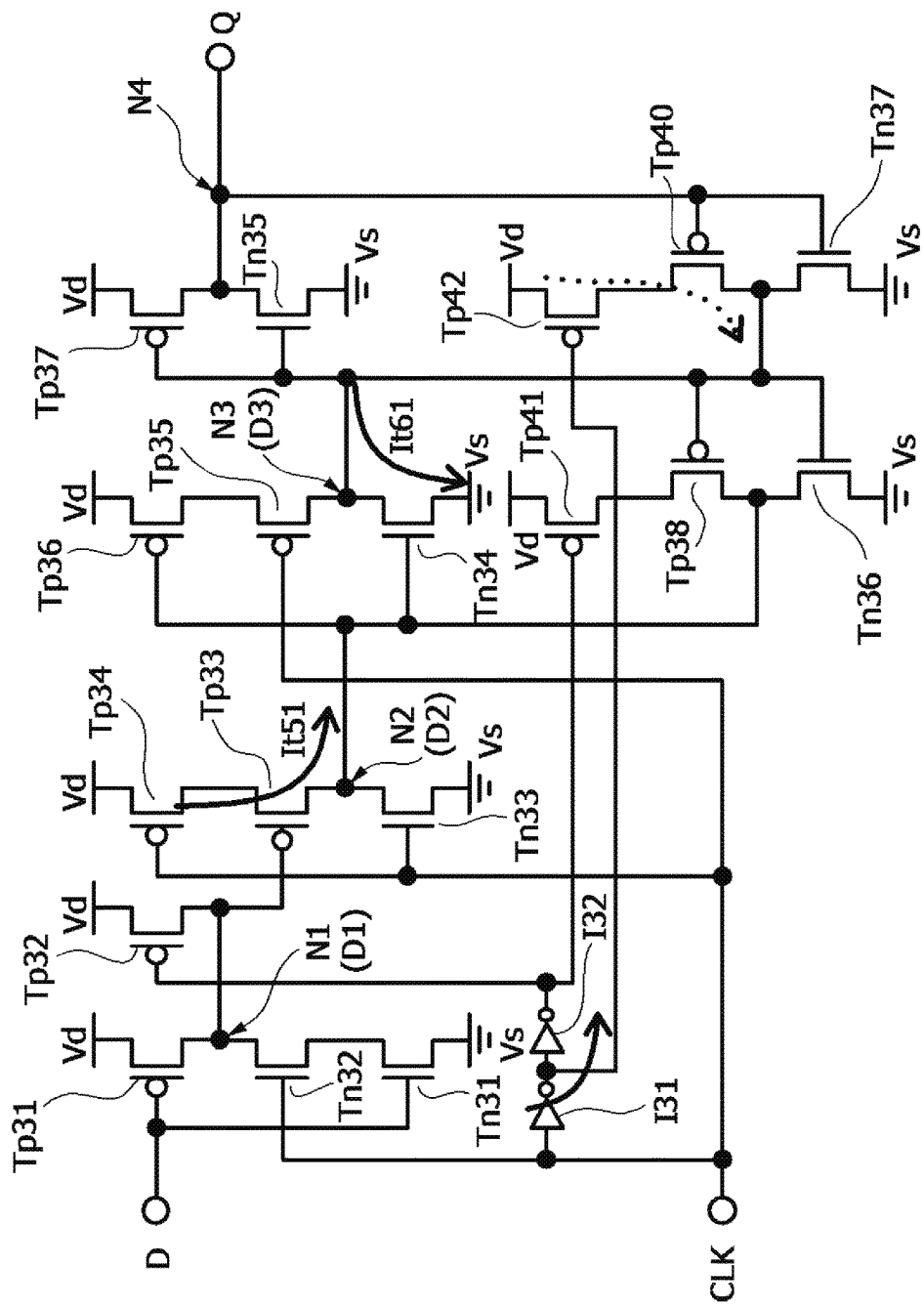
FIG. 8 is a diagram of assistance in explaining operation of the flip-flop circuit illustrated in FIG. 7.

FIG. 8 is a diagram of assistance in explaining operation of the flip-flop circuit illustrated in FIG. 7. Incidentally, the flip-flop circuit illustrated in FIG. 8 captures data D in timing in which the clock CLK falls from a high level "High" to a low level "Low."

As illustrated in FIG. 8, the flip-flop circuit according to the first embodiment includes n-type transistors Tn31 to Tn37, and p-type transistors Tp31 to Tp38 and Tp40 to Tp42. The data D is input to the gates of the transistors Tn31 and Tp31. The clock CLK is input to the gates of the transistors Tn32, Tn33, Tp34, and Tp35. Incidentally, the output signal of the inverter I31, which output signal is obtained by delaying CLK by a first delay time and logically inverting CLK, is input to the gate of the transistor Tp42. In addition, the output signal of the inverter I32, which output signal is obtained by delaying CLK by a second delay time longer than the first delay time, is input to the gate of the transistor Tp41.

A signal D1 of a common coupling node N1 of the transistors Tn32, Tp31, and Tp32 is input to the gate of the transistor Tp33. In addition, a signal D2 of a coupling node N2 of the transistors Tn33 and Tp33 is input to the gates of the transistors Tn34 and Tp36 and a coupling node of the transistors Tn36 and Tp38. Further, a signal D3 of a coupling node N3 of the transistors Tn34 and Tp35 is input to the gates of the transistors Tn35 and Tp37 (input of an inverter). Data Q is output from a coupling node N4 of the transistors Tn35 and Tp37 (output of the inverter).

Here, during a period during which the clock CLK is "High," the transistors Tn32 and Tn33 are on, and the transistors Tp34 and Tp35 are off. At this time, when the input data D is "High," the node N1 becomes "Low" to turn on Tp33. However, because Tp34 is off and Tn33 is on, the node N2 becomes "Low." Thereby, Tn34 is turned off and Tp36 is turned on. However, because Tp35 is off, the node N3 is set in a floating state. In addition, when the input data D is "Low," the node N1 becomes "High" to turn off Tp33. Because Tn33 is on, the node N2 becomes "Low." Thereby, Tn34 is turned off and Tp36 is turned on. However, because Tp35 is off, the node N3 is set in a floating state. For example, during the period during which the clock CLK is at the high level "High," the node N3 is set in a floating state.

On the other hand, during a period during which the clock CLK is "Low," the transistors Tn32 and Tn33 are off, and the transistors Tp34 and Tp35 are on. In addition, when the clock CLK changes from "High" to "Low," the transistor Tp32 changes from off to on after a delay time provided by the inverters I31 and I32 (clock delay circuit). At this time, when the input data D is "High," the node N1 is set in a floating state. However, the node N1 changes to "High" after the delay time provided by the clock delay circuit (I31 and I32). In addition, when the input data D is "Low," the node N1 becomes "High."

In the flip-flop circuit illustrated in FIG. 7 and FIG. 8, when both the data (first data) D2 of N2 and the data (second data) D3 of N3 are "Low," and CLK changes from "High" to "Low," racing may occur unless N3 changes before N2. Here, the second data represents data immediately before the first data (data captured by an immediately preceding clock).

In addition, with respect to the node N3, as described with reference to FIG. 3, when CLK changes from "High" to "Low," and, for example, the data D2 of N2 changes from "Low" to "High," a conflict may be caused between the n-type transistor Tn34 and the p-type transistor Tp42. In addition, with respect to the node N2, when CLK changes from "High" to "Low," and, for example, the data D2 of N2 changes from "Low" to "High," a conflict may be caused between the p-type transistors Tp33 and Tp34 and the n-type transistor Tn36.

However, in the present first embodiment, the p-type transistor Tp41 is provided between the high-potential power supply line Vd and the p-type transistor Tp38, and the p-type transistor Tp42 is provided between the high-potential power supply line Vd and the p-type transistor Tp40. Here, CLK delayed by the inverters I31 and I32 is input to the gate of Tp41, and CLK delayed and logically inverted by the inverter I31 is input to the gate of Tp42. Tp42 is thus set in an off state after maintaining an on state for a period longer by the first delay time provided by the inverter I31 after CLK changes from "High" to "Low." In addition, Tp41 changes from an off state to an on state with a delay of the second delay time provided by the inverters I31 and I32 after CLK changes from "High" to "Low."

For example, the p-type transistor Tp41 maintains the off state even when CLK changes from "High" to "Low" and Tp33 and Tp34 are turned on (current It51 flows). Then, Tp41 is set in an on state after new data is transmitted as the data D3 of the node N3, so that the new data D3 is held. In addition, Tp42 is, for example, off during a period that the node N2 becomes "High," and may avoid a conflict between the p-type transistor Tp42 and the n-type transistor Tn34 when the level of the node N3 starts make a transition from "High" to "Low." For example, Tp42 is off when the charge of the node N3 is drawn out by Tn34 (current It61 flows), and Tp42 is on after the level of the node N3 sufficiently changes to "Low."

In the foregoing, for example, the configuration for avoiding a conflict at the node N2 and the configuration for avoiding a conflict at the node N3 may be applied independently. For example, the application of the present technology may be the configurations for avoiding conflicts at both of the nodes N2 and N3 (both Tp41 and Tp42 are provided) or may be the configuration for avoiding a conflict at one of the nodes N2 and N3 (either Tp41 or Tp42 is provided) may be provided.

Incidentally, in the flip-flop circuit according to the first embodiment illustrated in FIG. 8, the output of the inverter I31 (for example, an inverter in an odd-numbered stage) in the clock delay circuit is used as a control signal input to the gate of Tp42. In addition, the output of the inverter I32 (for example, an inverter in an even-numbered stage subsequent to I31) in the clock delay circuit is used as a control signal input to the gate of Tp41. It is thereby possible to use the output of the clock delay circuit (I31 and I32) without providing a new circuit for generating the control signals for Tp41 and Tp42. It is of course needless to say that a dedicated timing control circuit 3 that generates the control signals for Tp41 and Tp42 may be provided additionally.

Figure 9:
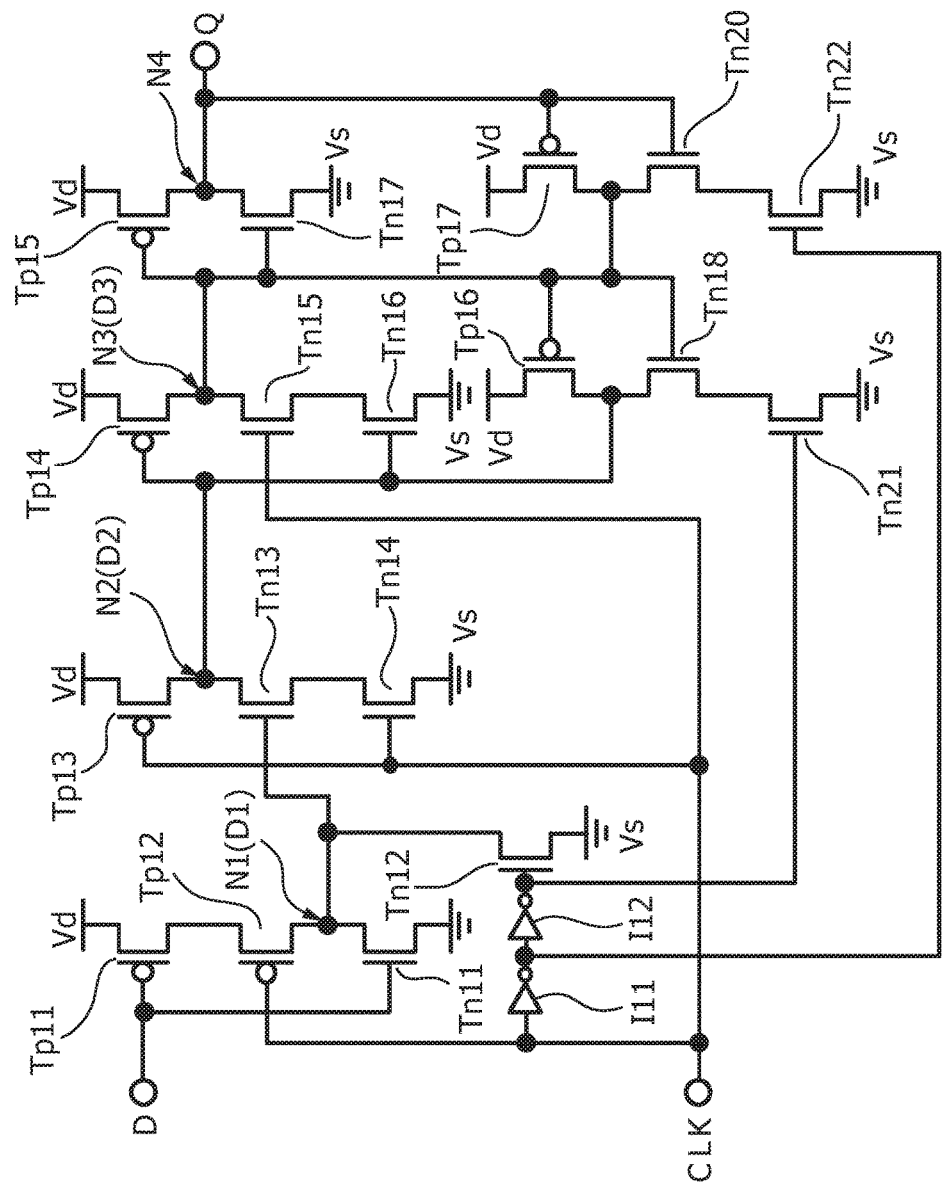
FIG. 9 is a circuit diagram illustrating a second embodiment of a flip-flop circuit.

FIG. 9 is a circuit diagram illustrating a second embodiment of a flip-flop circuit. The flip-flop circuit according to the second embodiment is obtained by reversing the polarity of the flip-flop circuit according to the first embodiment illustrated in FIG. 7, and corresponds to an application of the present technology to the flip-flop circuit illustrated in FIG. 2 described above. For example, the flip-flop circuit according to the second embodiment illustrated in FIG. 9 is formed by inserting an n-type transistor Tn22 between a low potential power supply line (second power supply line) Vs and the n-type (nMOS) transistor Tn20 in the flip-flop circuit illustrated in FIG. 2. In this case, the output of the inverter I11 (clock delay circuit: the timing control circuit 3) is input to the gate of the transistor Tn22. Further, in the flip-flop circuit according to the second embodiment, the n-type transistor Tn19 in the flip-flop circuit illustrated in FIG. 2 is replaced with an n-type transistor Tn21 that has the output of the inverter I12 input to a gate thereof. Incidentally, the transistors Tn21 and Tn22 correspond to a switch element 4 in FIG. 6A.

In the present second embodiment, CLK delayed by the inverters I11 and I12 is input to the gate of Tn21, and CLK delayed and logically inverted by the inverter I11 is input to the gate of Tn22. Tn22 is thus set in an off state after maintaining an on state for a period longer by the first delay time provided by the inverter I21 after CLK changes from "Low" to "High." In addition, Tn21 changes from an off state to an on state with a delay of the second delay time provided by the inverters I11 and I12 after CLK changes from "Low" to "High."

For example, the n-type transistor Tn21 maintains the off state even when CLK changes from "Low" to "High" and Tn13 and Tn14 are turned on. Then, Tn21 is set in the on state after new data is transmitted as the data D3 of the node N3, so that the new data D3 is held. In addition, Tn22 is, for example, off during a period that the node N2 becomes "Low," and may avoid a conflict between the n-type transistor Tn22 and the p-type (pMOS) transistor Tp14 when the level of the node N3 starts to make a transition from "Low" to "High."

Figure 10:
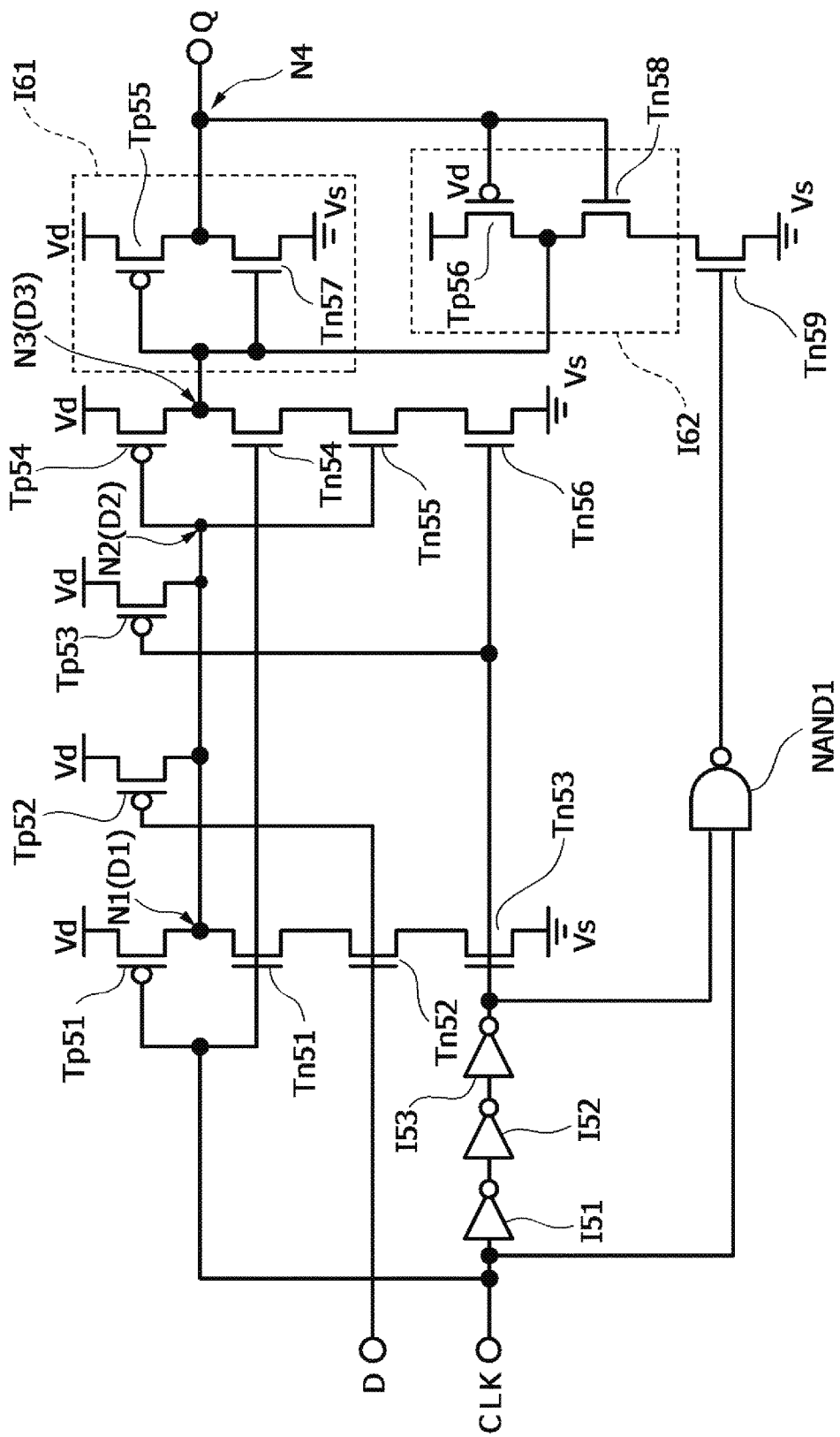
FIG. 10 is a circuit diagram illustrating a third embodiment of a flip-flop circuit.

FIG. 10 is a circuit diagram illustrating a third embodiment of a flip-flop circuit. The flip-flop circuit according to the third embodiment corresponds to an application of the present technology to the flip-flop circuit according to the third example illustrated in FIG. 4. In this case, the flip-flop circuit illustrated in FIG. 10 is formed by adding an nMOS (n-type) transistor to one inverter I62 of a keeper circuit (data hold circuit 2) formed by an inverter I61 (Tp55 and Tn57) and the inverter I62 (Tp56 and Tn58) whose inputs and outputs are cross-coupled. Further, an nMOS transistor Tn59 that has the output of a NAND gate NAND1 input to a gate thereof is disposed between the nMOS transistor Tn58 of the inverter I62 and a low potential power supply line Vs.

The clock CLK and CLK delayed and logically inverted by inverters I51 to I53 in an odd number of stages are input to the inputs of NAND1. The output of the NAND1 controls switching of Tn59 to avoid a conflict at the node N3. For example, when new data (D) is captured based on the clock CLK, the coupling of the data hold circuit 2 (keeper circuit) I61 and I62 is temporarily interrupted by the switching control of Tn59.

Figure 11:
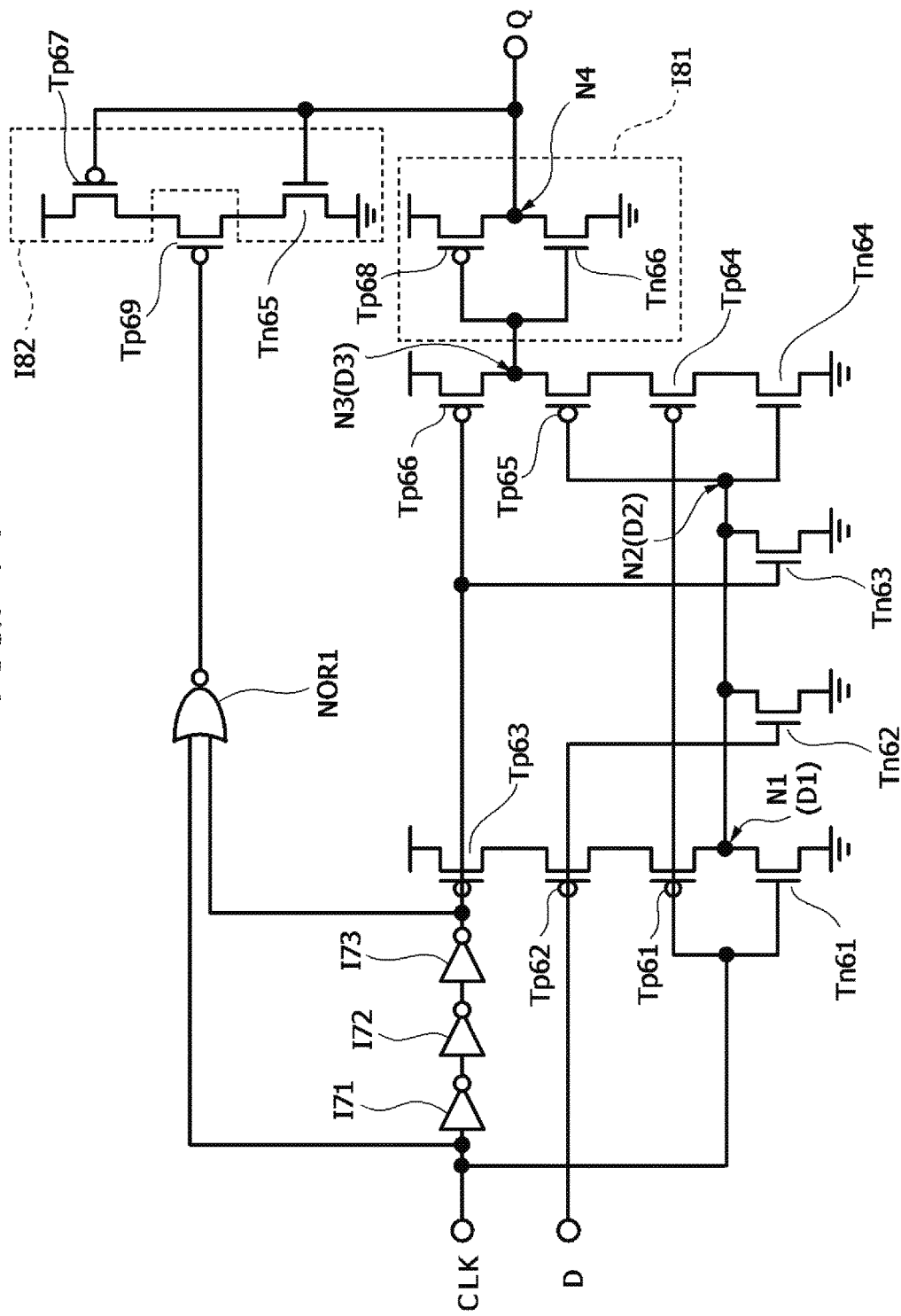
FIG. 11 is a circuit diagram illustrating a fourth embodiment of a flip-flop circuit.

FIG. 11 is a circuit diagram illustrating a fourth embodiment of a flip-flop circuit. The flip-flop circuit according to the fourth embodiment is obtained by reversing the polarity of the flip-flop circuit according to the third embodiment illustrated in FIG. 10. For example, in the flip-flop circuit according to the fourth embodiment illustrated in FIG. 11, p-type (pMOS) transistors Tp61 to Tp68 correspond to the nMOS transistors Tn51 to Tn58 in the flip-flop circuit according to the third embodiment. In addition, n-type (nMOS) transistors Tn61 to Tn66 in the flip-flop circuit according to the fourth embodiment correspond to the pMOS transistors Tp51 to Tp56 in the flip-flop circuit according to the third embodiment. Incidentally, inverters I71 to I73, I81, and I82, a p-type transistor Tp69, and a NOR gate NOR1 in the fourth embodiment correspond to the inverters I51 to I53, I62, and I61, the n-type transistor Tn59, and the NAND gate NAND1 in the third embodiment.

In the flip-flop circuit according to the fourth embodiment illustrated in FIG. 11, the clock CLK and CLK delayed and logically inverted by the inverters I71 to I73 in an odd number of stages are input to the inputs of NOR1. Then, the output of the NOR1 controls switching of Tp69 to avoid a conflict at the node N3. For example, when new data (D) is captured based on the clock CLK, the coupling of the data hold circuit 2 (keeper circuit) I81 and I82 is temporarily interrupted by the switching control of Tp69.

FIG. 12 is a diagram of assistance in explaining a result of simulation of operation of the flip-flop circuit illustrated in FIG. 11. An axis of ordinates indicates voltage. An axis of abscissas indicates time. In FIG. 12, a curve LL1 represents a result of simulation (output Q) of the flip-flop circuit according to the first embodiment described with reference to FIG. 7 and FIG. 8, and a curve LL2 represents a result of simulation (output Q) of the flip-flop circuit according to the second example described with reference to FIG. 3.

Incidentally, the transistors used in the flip-flop circuits are n-type and p-type organic transistors. In addition, in FIG. 12, as in the foregoing, reference character D indicates changes in data input to the flip-flop circuits, and CLK indicates changes in the clock.

As illustrated in FIG. 12, it is clear that when capturing data D of "Low" at a transition of the clock CLK from "High" to "Low," the flip-flop circuit (LL1) according to the first embodiment changes from "High" to "Low" more sharply than the flip-flop circuit (LL2) according to the second example. For example, it is clear that the flip-flop circuit according to the first embodiment may perform higher-speed operation than the flip-flop circuit according to the second example.

As described above in detail, the flip-flop circuit according to the present technology is widely applicable to flip-flop circuits of various configurations, and is promising particularly in cases where flip-flop circuits formed with organic transistors operating with low power consumption are applied to RFID. It is to be noted that the flip-flop circuit (semiconductor integrated circuit device) according to the present technology may be RFID using organic transistors or may be widely applied to various semiconductor integrated circuit devices. Further, the flip-flop circuit according to the present technology may be flip-flop circuits formed with organic transistors or may also use other transistors such as MOS transistors or the like, as described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A flip-flop circuit comprising:
a data capture circuit that captures data based on a clock;
a data hold circuit that holds an output of the data capture circuit based on the clock; and
a timing control circuit that controls coupling between the output of the data capture circuit and the data hold circuit based on the clock;
when the data capture circuit captures new data based on the clock, the timing control circuit performing control so as to temporarily interrupt the coupling between the output of the data capture circuit and the data hold circuit, wherein the data capture circuit includes
a first transistor of a first conductivity type and a second transistor of a second conductivity type different from the first conductivity type, the first transistor and the second transistor being arranged in series with each other between a first power supply line and a second power supply line and receiving the data by gates of the first transistor and the second transistor, and a third transistor of the second conductivity type, the third transistor being coupled between the first transistor and the second transistor and receiving the clock by a gate of the third transistor,
a clock delay circuit that delays the clock,
a fourth transistor of the first conductivity type, the fourth transistor receiving the clock delayed by the clock delay circuit and being disposed between the first power supply line and a first node to which the first transistor and the third transistor are coupled, and
a fifth transistor of the first conductivity type and a sixth transistor of the second conductivity type, the fifth transistor and the sixth transistor being arranged in series with each other between the first power supply line and the second power supply line and receiving the clock by gates of the fifth transistor and the sixth transistor, and a seventh transistor of the first conductivity type, the seventh transistor being coupled between the fifth transistor and the sixth transistor and receiving a signal of the first node by a gate of the seventh transistor.

2. The flip-flop circuit according to claim 1, wherein the timing control circuit temporarily interrupts the coupling between the output of the data capture circuit and the data hold circuit based on a signal obtained by delaying the clock.

3. The flip-flop circuit according to claim 1, wherein the data hold circuit includes
a first circuit that drives first data, and
a second circuit that holds second data immediately preceding the first data,
the first circuit and the second circuit drive potential of a same node, and
the timing control circuit controls a switch element disposed between the second circuit and a power supply line.

4. The flip-flop circuit according to claim 1, wherein the data hold circuit includes
a first data holding unit that holds a signal of a second node to which the sixth transistor and the seventh transistor are coupled, and
a second data holding unit that holds a signal of a third node as an output of the first data holding unit,
the first data holding unit includes
an eighth transistor of the first conductivity type and a ninth transistor of the second conductivity type, the eighth transistor and the ninth transistor being arranged in series with each other between the first power supply line and the second power supply line and receiving the signal of the second node by gates of the eighth transistor and the ninth transistor,
a tenth transistor of the first conductivity type, the tenth transistor being coupled between the eighth transistor and the ninth transistor and receiving the clock by a gate of the tenth transistor, and
an eleventh transistor of the first conductivity type and a twelfth transistor of the second conductivity type, the eleventh transistor and the twelfth transistor receiving the signal of the third node by gates of the eleventh transistor and the twelfth transistor, and
the second data holding unit includes
a thirteenth transistor of the first conductivity type and a fourteenth transistor of the second conductivity type, the thirteenth transistor and the fourteenth transistor being arranged in series with each other between the first power supply line and the second power supply line and receiving the signal of the third node by gates of the thirteenth transistor and the fourteenth transistor, and
a fifteenth transistor of the first conductivity type and a sixteenth transistor of the second conductivity type, the fifteenth transistor and the sixteenth transistor receiving, by gates of the fifteenth transistor and the sixteenth transistor, a signal of a fourth node to which the thirteenth transistor and the fourteenth transistor are coupled.

5. The flip-flop circuit according to claim 4, wherein the timing control circuit controls
a seventeenth transistor of the first conductivity type, the seventeenth transistor being coupled between the first power supply line and the eleventh transistor, and
an eighteenth transistor of the first conductivity type, the eighteenth transistor being coupled between the first power supply line and the fifteenth transistor.

6. The flip-flop circuit according to claim 5, wherein the timing control circuit doubles as the clock delay circuit,
the seventeenth transistor is controlled by a signal having a first delay, the signal having the first delay being an output of an inverter in an even-numbered stage in the clock delay circuit, and
the eighteenth transistor is controlled by a signal having a second delay shorter than the first delay, the signal having the second delay being an output of an inverter in an odd-numbered stage in the clock delay circuit.

7. The flip-flop circuit according to claim 1, wherein the transistors of the first conductivity type are p-type organic transistors, and
the transistors of the second conductivity type are n-type organic transistors.

8. A semiconductor integrated circuit device comprising:
a flip-flop circuit including
a data capture circuit that captures data based on a clock,
a data hold circuit that holds an output of the data capture circuit based on the clock, and
a timing control circuit that controls coupling between the output of the data capture circuit and the data hold circuit based on the clock,
when the data capture circuit captures new data based on the clock, the timing control circuit performing control so as to temporarily interrupt the coupling between the output of the data capture circuit and the data hold circuit, wherein the data capture circuit includes
a first transistor of a first conductivity type and a second transistor of a second conductivity type different from the first conductivity type, the first transistor and the second transistor being arranged in series with each other between a first power supply line and a second power supply line and receiving the data by gates of the first transistor and the second transistor, and a third transistor of the second conductivity type, the third transistor being coupled between the first transistor and the second transistor and receiving the clock by a gate of the third transistor,
a clock delay circuit that delays the clock,
a fourth transistor of the first conductivity type, the fourth transistor receiving the clock delayed by the clock delay circuit and being disposed between the first power supply line and a first node to which the first transistor and the third transistor are coupled, and
a fifth transistor of the first conductivity type and a sixth transistor of the second conductivity type, the fifth transistor and the sixth transistor being arranged in series with each other between the first power supply line and the second power supply line and receiving the clock by gates of the fifth transistor and the sixth transistor, and a seventh transistor of the first conductivity type, the seventh transistor being coupled between the fifth transistor and the sixth transistor and receiving a signal of the first node by a gate of the seventh transistor.

9. The semiconductor integrated circuit device according to claim 8, wherein
the semiconductor integrated circuit device is a radio frequency identification.

10. A semiconductor integrated circuit device comprising:
a flip-flop circuit including
a data capture circuit that captures data based on a clock,
a data hold circuit that holds an output of the data capture circuit based on the clock, and
a timing control circuit that controls coupling between the output of the data capture circuit and the data hold circuit based on the clock,
when the data capture circuit captures new data based on the clock, the timing control circuit performing control so as to temporarily interrupt the coupling between the output of the data capture circuit and the data hold circuit, the semiconductor integrated circuit device being a radio frequency identification.

* * * * *